US011342491B2

(12) United States Patent
Ambrose et al.

(10) Patent No.: US 11,342,491 B2
(45) Date of Patent: May 24, 2022

(54) MAGNETIC JOSEPHSON JUNCTION SYSTEM

(71) Applicants: Thomas F. Ambrose, Crownsville, MD (US); Melissa G. Loving, College Park, MD (US); Alastair Charlie Fisher, Mahwah, NJ (US)

(72) Inventors: Thomas F. Ambrose, Crownsville, MD (US); Melissa G. Loving, College Park, MD (US); Alastair Charlie Fisher, Mahwah, NJ (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 80 days.

(21) Appl. No.: 17/035,147

(22) Filed: Sep. 28, 2020

(65) Prior Publication Data
US 2022/0102611 A1 Mar. 31, 2022

(51) Int. Cl.
*H01L 39/02* (2006.01)
*H01L 27/18* (2006.01)
(Continued)

(52) U.S. Cl.
CPC .......... *H01L 39/025* (2013.01); *H01L 27/18* (2013.01); *H01L 39/12* (2013.01); *H01L 39/223* (2013.01); *H01L 39/2493* (2013.01)

(58) Field of Classification Search
CPC ....... H01L 39/025; H01L 27/18; H01L 39/12; H01L 39/223; H01L 39/2493
See application file for complete search history.

(56) References Cited

U.S. PATENT DOCUMENTS 5,295,093 A 3/1994 Nagasawa
5,398,030 A 3/1995 Sandell
(Continued)

FOREIGN PATENT DOCUMENTS

JP H076329 A 1/1995
JP H09128970 A 5/1997
(Continued)

OTHER PUBLICATIONS

Non Final Office Action for U.S. Appl. No. 17/021,675 dated Apr. 8, 2021.
(Continued)

*Primary Examiner* — Matthew L Reames
(74) *Attorney, Agent, or Firm* — Tarolli, Sundheim, Covell & Tummino LLP

(57) ABSTRACT

One example includes a magnetic Josephson junction (MJJ) system. The system includes a first superconducting material layer and a second superconducting material layer each configured respectively as a galvanic contacts. The system also includes a ferrimagnetic material layer arranged between the first and second superconducting material layers and that is configured to exhibit a fixed net magnetic moment at a predetermined operating temperature of the MJJ system. The system also includes a ferromagnetic material layer arranged between the first and second superconducting material layers and that is configured to exhibit a variable magnetic orientation in response to an applied magnetic field. The MJJ system can be configured to store a binary logical value based on a direction of the variable magnetic orientation of the ferromagnetic material layer. The system further includes a spacer layer arranged between the ferromagnetic and the ferrimagnetic material layers.

20 Claims, 6 Drawing Sheets

(51) Int. Cl.
*H01L 39/24* (2006.01)
*H01L 39/22* (2006.01)
*H01L 39/12* (2006.01)

(56) References Cited

U.S. PATENT DOCUMENTS

| | | | |
|---|---|---|---|
| 6,418,065 | B2 | 7/2002 | Sato et al. |
| 6,710,986 | B1 | 3/2004 | Sato et al. |
| 9,214,624 | B2 | 12/2015 | Lee et al. |
| 9,520,180 | B1 | 12/2016 | Mukhanov et al. |
| 9,613,699 | B1 | 4/2017 | Reohr et al. |
| 11,024,791 | B1 | 6/2021 | Murduck et al. |
| 2013/0040818 | A1 | 2/2013 | Herr et al. |
| 2015/0043273 | A1 | 2/2015 | Naaman et al. |
| 2018/0025775 | A1 | 1/2018 | Ambrose |
| 2020/0243132 | A1* | 7/2020 | Loving ............... H01L 39/12 |
| 2021/0005249 | A1 | 1/2021 | Naaman et al. |
| 2021/0066572 | A1 | 3/2021 | Ambrose et al. |

FOREIGN PATENT DOCUMENTS

| | | |
|---|---|---|
| JP | 2000090009 A | 3/2000 |
| JP | 2000091665 A | 3/2000 |
| JP | 2000268579 A | 9/2000 |
| JP | 2003318465 A | 11/2003 |
| JP | 2016535383 A | 11/2016 |
| WO | 2016094020 A1 | 6/2016 |
| WO | 2020205031 A2 | 10/2020 |

OTHER PUBLICATIONS

Bell C et al.: "Controllable Josephson current through a pseudospin-valve structure", Applied Physics Letters, vol. 84, No. 7, Feb. 16, 2004 (Feb. 16, 2004), pp. 1153-1155, XP012062116, ISSN: 0003-6951, DOI 10.1063/1.1646217 p. 1153.

Madden A E et al.: "Phase controllable Josephson junctions for cryogenio memory", Superconductor Science and Technology,vol. 32, No. 1,015001, Nov. 16, 2018 (Nov. 16, 2018), XP020333147, ISSN 0953-2048, DOI: 10.1088/1361-6668/AAE8CF section 2; figure 1.

Niedzielski B M et al: "Use of Pd—Fe and Ni—Fe—Nb as Soft Magnetic Layers in Ferromagnetic Josephson Junctions for Non-volatile Cryogenic Memory", IEEE Transactions on App Li Ed Superconductivity, vol. 24, No. 4, 1800307, Aug. 2014 (Aug. 2014), XP011544947, ISSN: 1051-8223, DOI: 10.1109/TASC.2014. 2311442 sections I I , I I I , V; figure 1.

International Search Report for Application No. PCT/US2020/ 061835 dated Mar. 4, 2021.

European Office Action for Application No. 20188202.4-1206/ 3764543 dated Apr. 7, 2021.

Toshishige Yamada et al.: "Current-injection Josephson latch employing a single-flux quantum. II", Journal of Applied Physics, American Institute of Physics, US, vol. 59, No. 9, May 1, 1986 (May 1, 1986), pp. 3202-3207, XP001629332, ISSN: 0021-8979.

Zhang Y Met Al: "High-T/sub c/ superconductor oversampled delta modulator for analog-to-digital converters", IEEE Transactions on Applied Superconductivity, IEEE Service Center, Los Alamitos, CA, US, vol. 7, No. 2, Jun. 1, 1997 (Jun. 1, 1997), pp. 2292-2295, XP011500920, ISSN: 1051-8223, DOI: 10.1109/77.621696.

Japanese Office Action for Application No. 2020-091149 dated Apr. 20, 2021.

Australian Examination Report for Application No. 2019308479 dated Jun. 23, 2021.

Extended European Search Report for Application No. 21163890. 3-1203 dated Jul. 14, 2021.

* cited by examiner

MAGNETIC JOSEPHSON JUNCTION SYSTEM

TECHNICAL FIELD

This disclosure relates generally to classical and superconducting computing systems, and more specifically to a magnetic Josephson junction (MJJ) system.

BACKGROUND

Superconducting electronics can be implemented to provide high-performance computing with low energy consumption. Superconducting Josephson junctions with magnetic barriers, also referred to as magnetic Josephson junctions (MJJs), can serve as the basis for Josephson magnetic random access memory (JMRAM). A JMRAM can rely on the oscillation of the relative Cooper pair phase with magnetic layer thickness to produce junctions that exhibit a Josephson phase of either zero or $\pi$, depending on the relative magnetic layer orientation. This binary phase switchability can be exploited to create superconducting memory elements capable of storing a logical "0" or logical "1" state. Memory unit elements can be arranged in arrays with read and write lines to create an addressable memory fabricated, for example, on an integrated circuit (IC) chip that can be cooled to cryogenic temperatures (e.g., around four Kelvin).

SUMMARY

One example includes a magnetic Josephson junction (MJJ) system. The system includes a first superconducting material layer and a second superconducting material layer each configured respectively as a galvanic contacts. The system also includes a ferrimagnetic material layer arranged between the first and second superconducting material layers and that is configured to exhibit a fixed net magnetic moment at a predetermined operating temperature of the MJJ system. The system also includes a ferromagnetic material layer arranged between the first and second superconducting material layers and that is configured to exhibit a variable magnetic orientation in response to an applied magnetic field. The MJJ system can be configured to store a binary logical value based on a direction of the variable magnetic orientation of the ferromagnetic material layer. The system further includes a spacer layer arranged between the ferromagnetic and the ferrimagnetic material layers.

Another example includes a method for fabricating an MJJ system. The method includes depositing a base electrode layer of a superconducting material and depositing a first buffer layer on a surface of the base electrode layer. The method also includes depositing one of a ferromagnetic material layer or a ferrimagnetic material layer on a surface of the first buffer layer and depositing a spacer layer on a surface of the one of the ferromagnetic material layer or the ferrimagnetic material layer. The method also includes depositing the other of the ferromagnetic material layer or the ferrimagnetic material layer on a surface of the spacer layer and depositing a second buffer layer on a surface of the other of the ferromagnetic material layer or the ferrimagnetic material layer. The method further includes depositing a top electrode layer of a superconducting material on a surface of the second buffer layer.

Another example includes an MJJ system. The system includes a first superconducting material layer and a second superconducting material layer each configured respectively as a galvanic contacts. The system also includes a ferrimagnetic material layer arranged between the first and second superconducting material layers. The ferrimagnetic material layer includes at least one of a material composition and a layer thickness that is configured to set a fixed net magnetic moment to approximately zero at a predetermined operating temperature of the MJJ system. The system also includes a ferromagnetic material layer arranged between the first and second superconducting material layers and that is configured to exhibit a variable magnetic orientation in response to an applied magnetic field. The MJJ system can be configured to store a binary logical value based on a direction of the variable magnetic orientation of the ferromagnetic material layer. The system further includes a spacer layer arranged between the ferromagnetic and the ferrimagnetic material layers.

DETAILED DESCRIPTION

Figure 1:
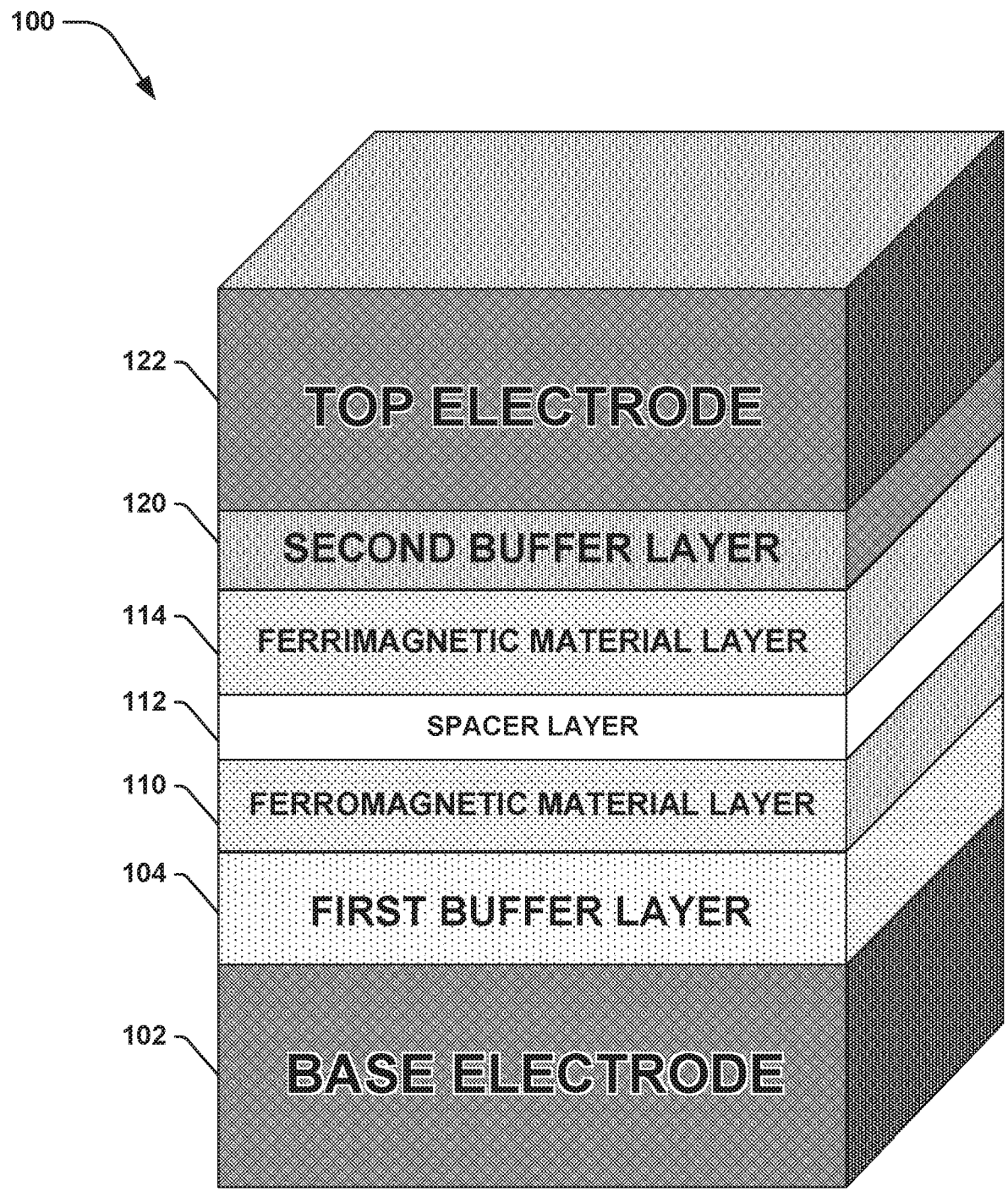
FIG. 1 illustrates an example of a magnetic Josephson junction (MJJ) device.

This disclosure relates generally to classical and superconducting computing systems, and more specifically to a magnetic Josephson junction (MJJ) system. A magnetic Josephson junction (MJJ) device can include a ferromagnetic material layer used as a magnetic "soft" or "free" layer that can exhibit a variable magnetic orientation, and a standalone ferrimagnetic material layer used as the magnetic "hard" or "fixed" layer (instead of, for example, a unitary ferromagnetic layer or a ferromagnetic/ferrimagnetic exchange-biased material bilayer). The MJJ device can be implemented in a Josephson magnetic random access memory (JMRAM) array. The MJJ system can therefore be implemented to construct a robust and reliable cryogenic computer memory that can be used for high-speed superconducting computing (e.g., with clock speeds in the microwave frequency range).

An MJJ is similar to a magnetic tunnel junction (MTJ) used in a non-superconducting magnetoresistive random-access memory (MRAM) cell in that it has a free magnetic layer capable of writing a magnetic state and a fixed magnetic layer used to reference the written magnetic state. As an example, the ferrimagnetic layer can be fabricated with at least one of a material composition and a layer thickness that can be configured to set a net magnetic moment of the ferrimagnetic material layer to approximately zero at a compensation point corresponding to a predetermined temperature of operation of the respective MJJ system (e.g., at cryogenic temperatures of approximately 5 Kelvin or less), thereby mitigating magnetic coupling of the ferrimagnetic material layer with the ferromagnetic material layer (e.g., through a spacer layer arranged between the ferromagnetic and ferrimagnetic material layers). Accordingly, the magnetic moment of the ferromagnetic material layer can represent one of two binary states: a first direction (e.g., first orientation) of the ferromagnetic material layer can be used to represent a first logic state (e.g., a logical "0"), and a second direction (e.g., second orientation) of the ferromagnetic material layer opposite the first direction can be used to represent a second logic state (e.g., a logical "1").

An MJJ-based memory differs from non-superconducting MRAM in both operating temperature (the MJJ being configured to operate at the cryogenic temperatures characteristic of superconducting circuits) as well as the use of superconducting material (e.g., niobium) as its contact layers. Additionally, in a non-superconducting MRAM cell, readback is performed via a resistance measurement, whereas readback of an MJJ is based on detecting the superconducting phase of the memory cell. Construction of reliable memories using MJJs has posed challenges in optimizing simultaneously the magnetics and superconductivity of the MJJ devices. Many configurations that appear to be optimized magnetically show suboptimal performance as superconductors, and vice-versa. A major challenge is that the fixed magnetic layer that serves as the hard magnetic phase of the MJJ structure may switch over a broad range of applied magnetic fields, including the field range where the free layer switches. Therefore, the fixed magnetic layer that serves as the hard magnetic phase of the MJJ structure can create an indistinct reference state and can couple to the free magnetic layer such that the free magnetic layer does not switch coherently.

The MJJ system described herein addresses this dual problem with the interaction of the two magnetic layers by replacing the fixed magnetic layer of an MJJ or a ferromagnetic/ferrimagnetic bilayer with a standalone ferrimagnetic layer. The standalone ferrimagnetic material layer is self-pinning, and therefore does not need to be coupled to a ferromagnetic material layer or antiferromagnetic layer (e.g., in a bilayer configuration) to provide a stabilized reference state. Additionally, the standalone ferrimagnetic material layer can provide for a more simplistic device that implements fewer layers, thus allowing for a superconducting phase shift based on only two layers and resulting in a greater critical current to facilitate the use of a lower current amplitude for other portions of the circuit. As described previously, the standalone ferrimagnetic material layer can be fabricated to exhibit a net magnetic moment of approximately zero at the compensation point corresponding to a predetermined layer thickness, composition, and/or operating temperature. Therefore, the distinction between the first and second directions of the magnetic moment of the ferromagnetic material layer, and thus the respective logic states, can result in a greater signal-to-noise ratio (SNR) between the respective logic states.

FIG. 1 illustrates an example of a magnetic Josephson junction (MJJ) device 100. The MJJ device 100 includes a barrier between two galvanic terminals, that, in accordance with the provision of appropriate control inputs, switches between magnetic alignment states respectively representative of binary logical values "0" and "1" and is readable for those states when implemented in a memory cell. As shown, the MJJ device 100 includes at least base and top electrode layers 102, 122 each formed of a superconducting material. The MJJ device 100 also includes a ferromagnetic material layer 110 and a ferrimagnetic material layer 114. First and second buffer layers 104, 120 can separate the ferromagnetic and ferrimagnetic material layers 110 and 114 from the respective superconducting-material electrodes 102, 122. A spacer layer 112 (e.g., formed of a metal material) can separate the ferromagnetic and ferrimagnetic material layers 110 and 114 from each other. As illustrated, ferromagnetic material layer 110 serves as a "free" or "switching" layer fabricated using soft magnetic materials with relatively low magnetic coercivity, and the ferrimagnetic material layer serves as a "fixed" layer. Together, the illustrated layers can form a pillar that can be on the order of approximately one micrometer by approximately two micrometers in size, typically elliptical in shape, when viewed in a plan view. It is to be understood that the arrangement of the respective layers is not limited to the example of FIG. 1, but could instead be varied (e.g., by switching the relative location of the ferromagnetic and ferrimagnetic material layers 110 and 114 above and below the spacer layer 112).

As an example, the buffer layers 104 and 120 can each be arranged as multilayer buffer layers that each include alternating layers of materials of differing crystal phase that can be immiscible with respect to each other. As described herein, the phrase "immiscible with respect to each other" refers to the failure of the alternating material layers to alloy with each other (e.g., the two materials do not intermix at the interfaces between them), such that a sharp interface is achieved between the alternating materials. For example, the multilayer buffer layers 104 and 120 can each include a quantity four or more of a first material, with an equal or almost equal (e.g., one fewer layer) quantity of interleaved layers of a second material. As an example, the alternating materials can have differing crystal phase with respect to each other, such that the material of every other layer in the multilayer buffer layer 104 can have a face-centered cubic (FCC) unit cell, while the material of alternating layers between the FCC layers can have a body-centered cubic (BCC) unit cell. For example, the multilayer buffer layers 104 and 120 can alternate between copper (Cu) and niobium (Nb), copper and tantalum (Ta), or niobium and tantalum. Each layer of the multilayer buffer layers 104 and 120 can be between about five and about ten angstroms in thickness, as an example, with the individual layer thicknesses as well as the number of repeats of each layer being optimized for each particular application (e.g., different thicknesses of the electrodes 102 and 122, respectively, as well as different electrode materials). For example, the multilayer buffer layers 104 and 120 can be arranged substantially similar to as described in U.S. patent application Ser. No. 16/352,542, entitled "Repeating Alternating Multilayer Buffer Layer," which is herein incorporated by reference.

As an example, electrodes 102, 122 can be fabricated of an s-wave superconducting material, e.g., niobium, niobium nitride, or aluminum. For example, the base electrode 102 can have a thickness of between about one hundred nanometers and about two hundred nanometers (e.g., about one hundred fifty nanometers), and the top electrode 122 can have a thickness of between about twenty nanometers and about one hundred nanometers (e.g., about fifty nanometers). The first buffer layer 104 can be included as a single nonmagnetic layer to smooth out roughness in the superconductor layer 102. As an example, the first buffer layer 104 can include copper and can have a thickness of between about one nanometer and about ten nanometers (e.g., about five nanometers). In other examples, the first buffer layer 104 can be provided as a multi-layer buffer layer (e.g., having alternating layers of different materials). The spacer layer 112 can be included as a nonmagnetic transition metal layer to separate the ferromagnetic and ferrimagnetic material layers 110 and 114 and can be fabricated, for example, of any one of elemental copper (Cu), elemental ruthenium (Ru), elemental iridium (Ir), or elemental rhodium (Rh) or multilayer structure such as Cu/Ru. Spacer layer 112 can have a thickness of, for example, between about 2.5 nanometers and about 7.5 nanometers (e.g., about 5 nanometers). The second buffer layer 120 (e.g., a capping layer) can be included to prevent inter diffusion and as a smoothing layer, and can be fabricated, for example, of copper with a thickness of between about one nanometer and about ten nanometers (e.g., about five nanometers).

Ferrimagnetic material layer 114 can be used to reference a binary state written to free magnetic layer 110. As an example, the ferrimagnetic material layer 114 can be formed from any of a variety of combinations of a 4f valence rare earth element paired with a 3d magnetic transition metal. For example, the ferrimagnetic material layer 114 can be formed from a $Gd_xFe_{1-x}$ binary alloy or any of a variety of other binary alloys (e.g., FeGd, GdCo, DyCo, etc.). As an example, the ferrimagnetic material layer 114 can be fabricated to exhibit a net magnetic moment of approximately zero at a predetermined compensation point corresponding to a predetermined operating temperature of the MJJ device 100 (e.g., a cryogenic temperature that is less than or equal to approximately 5 Kelvin). Therefore, the magnetic coupling of the ferrimagnetic material layer 114 to the ferromagnetic material layer 110 can be mitigated, as described in greater detail herein.

The ferromagnetic material layer 110 can, for example, be formed of 80:20 nickel-iron permalloy ($Ni_{80}Fe_{20}$) and can have a thickness of between about 0.5 nanometers and about two nanometers (e.g., about 1.6 nanometers). Ferromagnetic material layer 110 can also, for example, be made of any one of elemental nickel (Ni), elemental cobalt (Co), elemental iron (Fe), a cobalt-iron alloy (e.g., 1:1 CoFe), a nickel-iron binary alloy (NiFe), or a nickel-iron ternary alloy (e.g., NiFeCr). The different alloys from which the ferromagnetic material layer 110 can be formed can be provided in any of a variety of different alloy concentrations to provide variable magnetic orientation properties and maintains critical current transparency.

Figure 2:
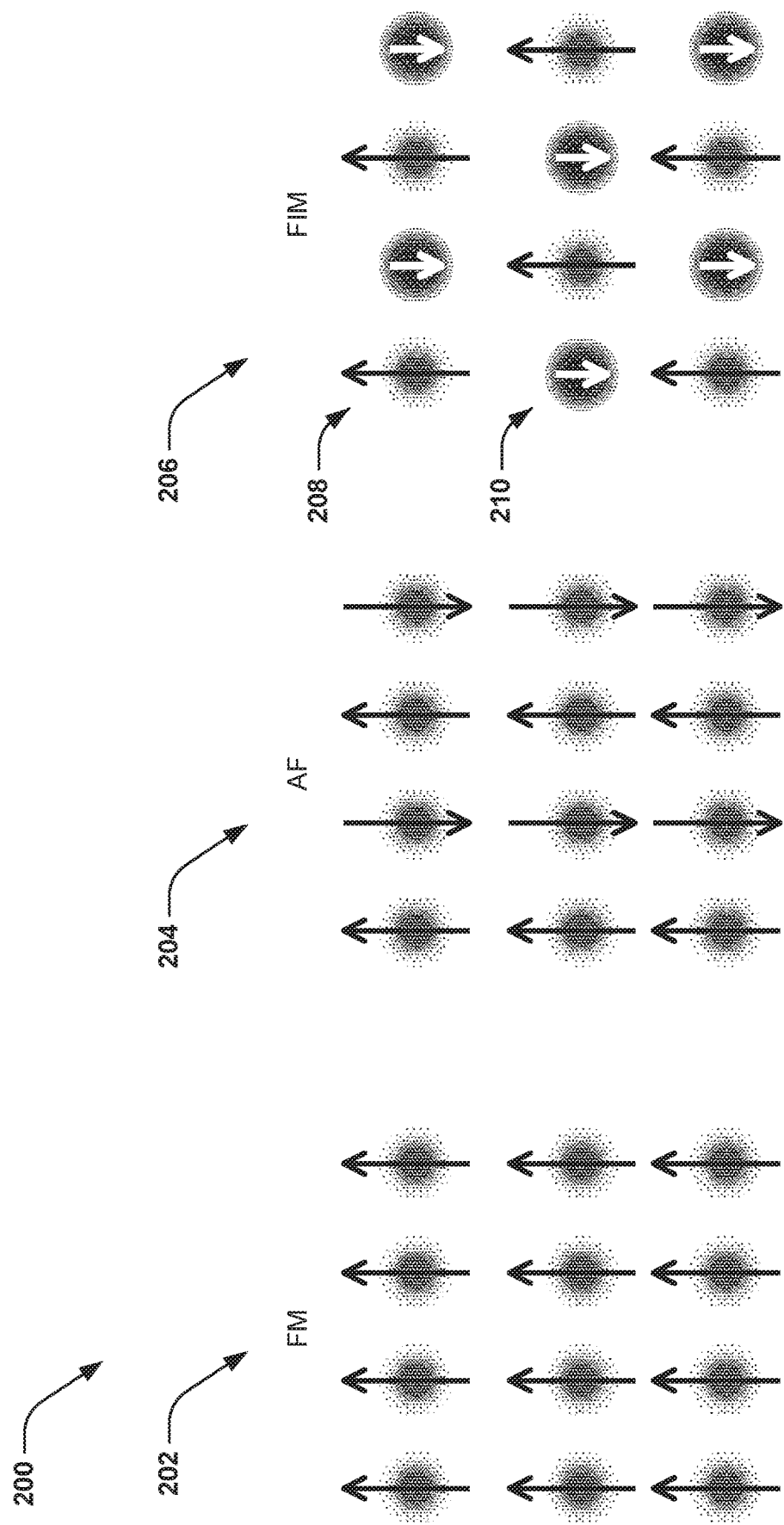
FIG. 2 illustrates an example of spin magnetic moment vector alignment diagrams for example ferromagnetic, antiferromagnetic, and ferrimagnetic materials, respectively.

FIG. 2 illustrates an example diagram 200 of spin magnetic moment vector alignment diagrams. The diagram 200 demonstrates a first example 202 that demonstrates the magnetic moment of a ferromagnetic material (FM), a second example 204 that demonstrates the magnetic moment of an anti-ferromagnetic material (AF), and a third example 206 that demonstrates the magnetic moment of a ferrimagnetic material (FIM). The shaded circular areas represent atomic nuclei, whereas the arrows each represent a moment vector corresponding to the magnetic spin of each atomic nucleus. The first example 202 thus illustrates a net spin magnetic moment of the FM structure being greater than zero. The second example 204 thus illustrates the spin magnetic moment of the AF structure having antiparallel magnetic moments that cancel each other out to result in a net spin magnetic moment of zero.

The third example 206 thus illustrates the spin magnetic moment of the FIM structure having uncompensated spins such that the net magnetic moment can be greater than zero, but still with an antiparallel configuration of the moments. In the example of FIG. 2, the FIM structure has magnetic moments 208 in a first direction that are greater than magnetic moments 210 in a second direction opposite the first. However, as described previously, the FIM structure can be fabricated to have at least one of a material composition and a layer thickness such that the net magnetic moment can be set to approximately zero at a predetermined compensation point, such as a predetermined operating temperature of the MJJ device 100. Therefore, based on the material composition, the magnetic moments 210 and the magnetic moments 208 can be approximately equal and opposite to provide for an approximately net zero magnetic moment of the respective FIM structure. However, as opposed to the AF structure, the FIM structure can provide a superconducting phase corresponding to a spontaneous supercurrent resulting from a π-state of the respective MJJ device 100, and which is thus associated with a given one of the logic states of the respective MJJ system 100.

Figure 3:
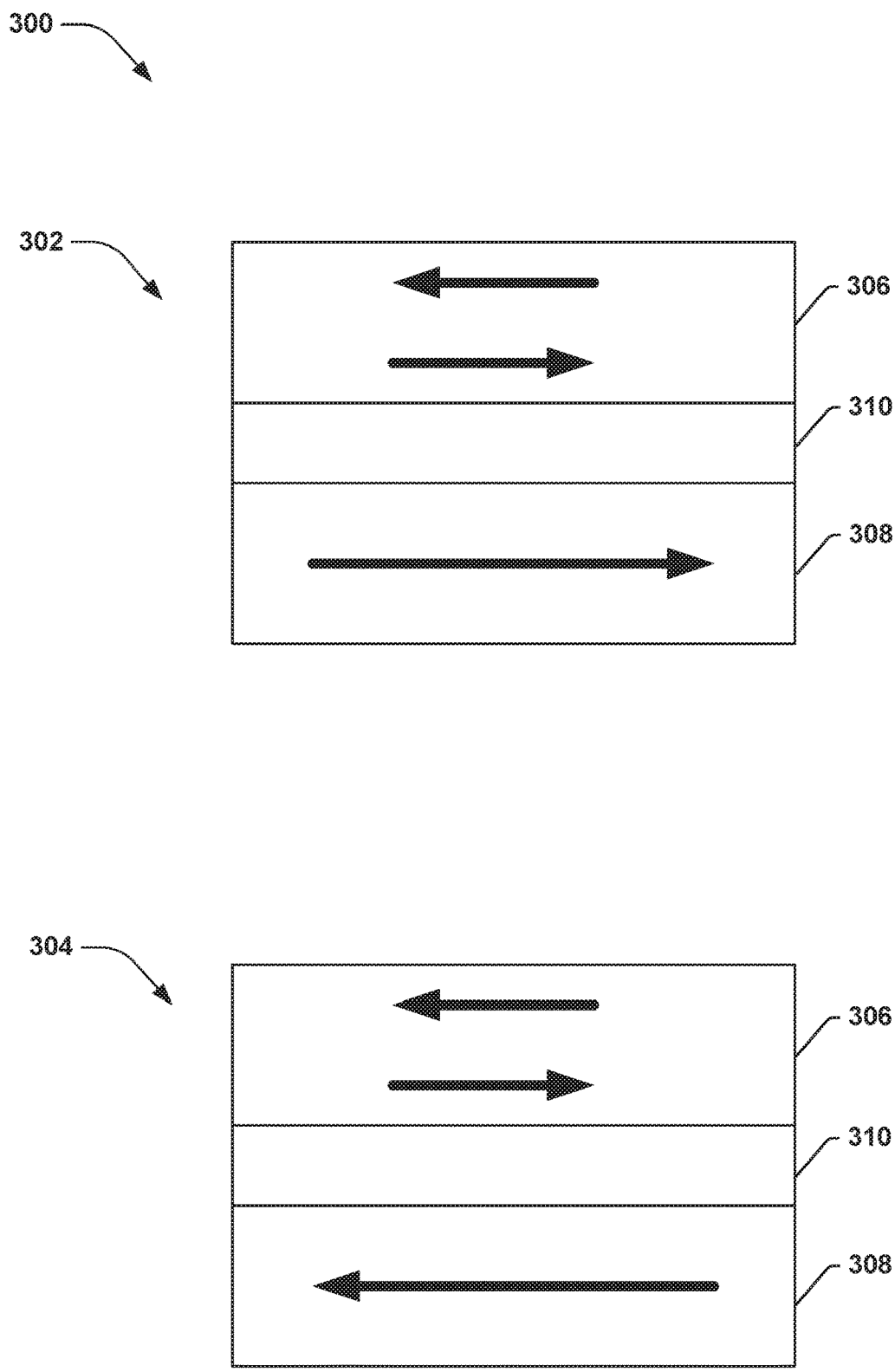
FIG. 3 illustrates an example diagram of magnetic moment states of an MJJ device.

FIG. 3 illustrates an example diagram 300 of magnetic orientation states of an MJJ device. As an example, the MJJ device in the diagram 300 can correspond to the MJJ device 100 in the example of FIG. 1. Therefore, reference is to be made to the examples of FIGS. 1 and 2 in the following description of the example of FIG. 3.

The diagram 300 includes a first state 302 of the MJJ device and a second state 304 of the MJJ device. The MJJ device is demonstrated in each of the first and second states 302 and 304 of the diagram 300 as including a ferrimagnetic material layer 306, a ferromagnetic material layer 308, and a spacer layer 310 that is coupled to and interconnects the ferrimagnetic and ferromagnetic material layers 306 and 308. In each of the first and second states 302 and 304, the ferrimagnetic material layer 306 is demonstrated as including two approximately equal and opposite magnetic moments, such as described previously in the example of FIG. 2 based on at least one of a material composition and a layer thickness. Therefore, the ferrimagnetic material layer 306 can exhibit an approximately zero net magnetic moment in-plane with the approximate planar and parallel arrangements of the ferrimagnetic material layer 306, the ferromagnetic material layer 308, and the spacer layer 310. As a result, magnetic coupling between the ferrimagnetic material layer 306 and the ferromagnetic material layer 308 can be substantially mitigated.

In the first state 302, the ferromagnetic material layer 308 is demonstrated as having a first magnetic orientation corresponding to a first direction. For example, the first magnetic orientation can correspond to an induced magnetic orientation in response to an inductive coupling of the "soft" ferromagnetic material layer 308 to a write-line configured to conduct a write current in a first direction. Therefore, the first state 302 can correspond to a first logic state (e.g., logic 0) of the MJJ device 100, such as corresponding to a 0-state of the MJJ device 100. Similarly, in the second state 304, the ferromagnetic material layer 308 is demonstrated as having a second magnetic orientation corresponding to a second direction that is opposite the first direction in the first state 302. For example, the second magnetic orientation can correspond to an induced magnetic orientation in response to the inductive coupling of the "soft" ferromagnetic material layer 308 to the write-line configured to conduct the write current in a second direction opposite the first direction. Therefore, the second state 304 can correspond to a second logic state (e.g., logic 1) of the MJJ device 100, such as corresponding to a π-state of the MJJ device 100.

As described previously, the ferrimagnetic material layer 306 can exhibit an approximately zero net magnetic moment, such that magnetic coupling between the ferrimagnetic material layer 306 and the ferromagnetic material layer 308 can be substantially mitigated. As a result, the magnetic moments of the ferrimagnetic material layer 306 can be approximately equal and opposite to provide for a greater differentiation between the magnetic orientations of the ferromagnetic material layer 308 in each of the first and second states 302 and 304. Accordingly, the MJJ device 100 can exhibit a substantially greater SNR between the first and second states 302 and 304. In other words, the MJJ device 100 can exhibit substantially no magnetic coupling between the ferrimagnetic layer 306 and the ferromagnetic layer 308 to provide a substantially greater SNR as opposed to typical MJJ devices that exhibit magnetic coupling between the ferromagnetic material layer and a "hard" magnetic layer (e.g., another ferromagnetic material or a ferro/ferrimagnetic material bilayer). Accordingly, the MJJ device 100 can exhibit a greater operational distinction between the respective corresponding logic-states with fewer material layers, and thus with a greater critical current, than typical MJJ devices.

Figure 4:
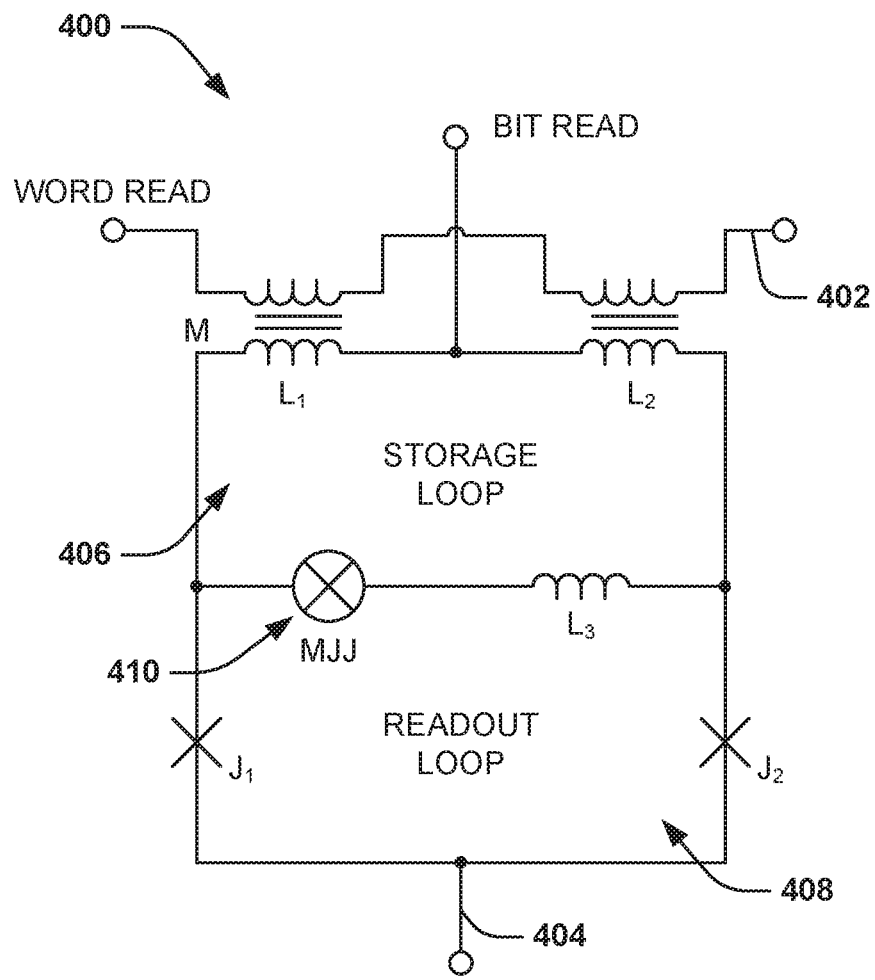
FIG. 4 illustrates an example of a circuit diagram of a memory unit cell that includes an MJJ device.

FIG. 4 illustrates an example of a circuit schematic of a JMRAM unit cell 400. The JMRAM unit cell 400 includes an RF-SQUID storage loop 406 and a direct-current DC-SQUID readout loop 408, and omitting write lines for simplicity of illustration. The storage loop 406 includes an MJJ device 410 that can correspond, for example, to the MJJ device 100 of FIG. 1, as well as inductors $L_1$, $L_2$, and $L_3$. Current provided through word read line 402 applies flux to a selected memory cell such that the current through bit read line 404 exceeds the readout SQUID critical current in one memory state, but not in the other. The storage loop 406 that encloses a spontaneously generated flux $\Phi_0/2$ (e.g., the superconducting phase) when the MJJ device 410 is in a π-state and zero flux otherwise. The loop linear inductance is greater than the Josephson inductance of the MJJ device 410. A portion of the stored flux is coupled into the DC-SQUID readout loop 408 and can be sensed by passing a bit-read current through bit read line 404. A word-read current through word read line 402 tunes the DC-SQUID flux such that in the memory state associated with the π-state of the MJJ device 410 (e.g., the superconducting phase corresponding to a $\Phi_0/2$ flux in the storage loop 406), the bit-read current causes the DC-SQUID to switch to its voltage state. In the other memory state, which is associated with a zero-state of the MJJ device 410 (e.g., no superconducting phase), the DC-SQUID critical current is higher than the bit-read current and the DC-SQUID remains in the zero-voltage state.

Figure 5:
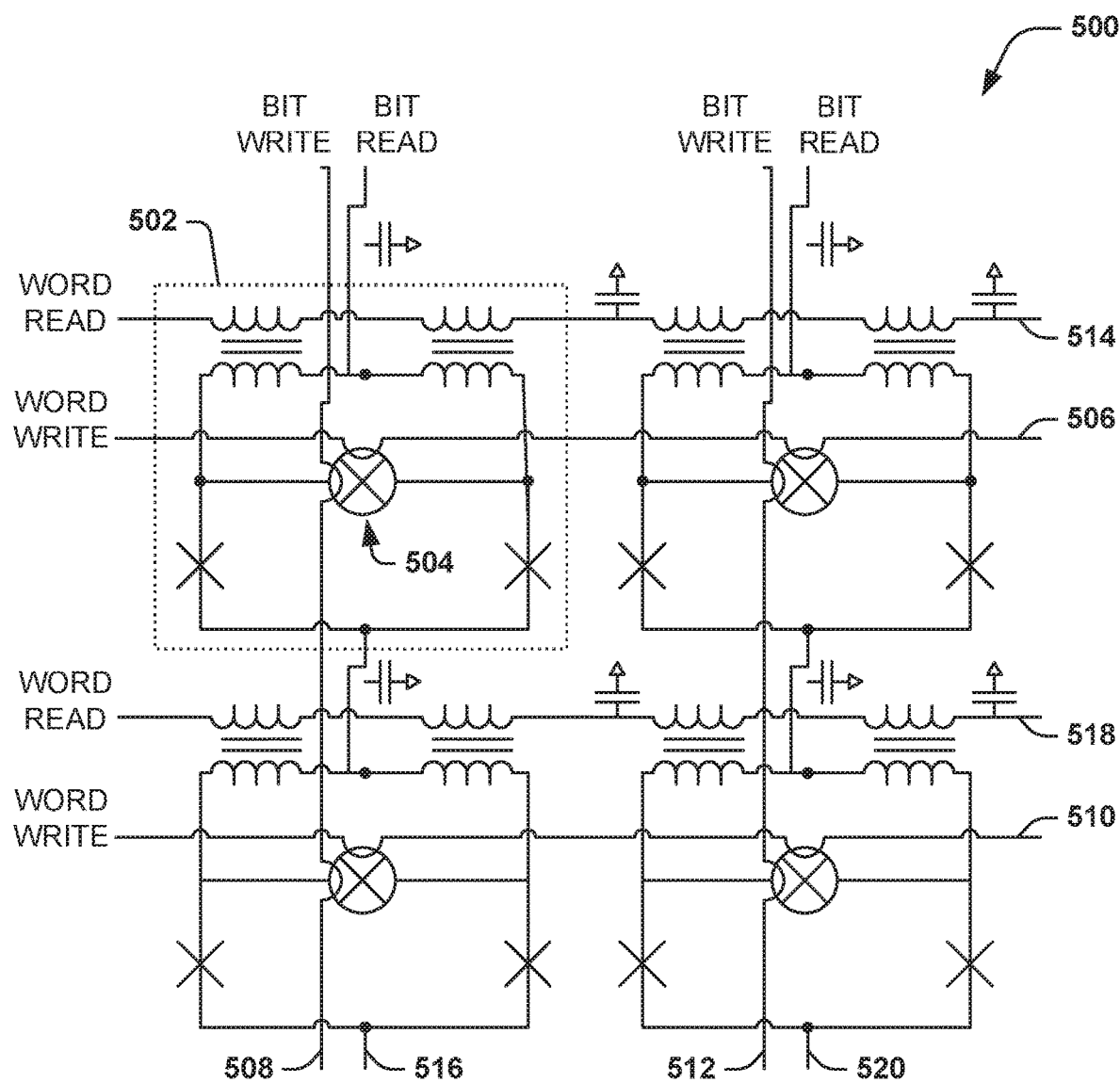
FIG. 5 illustrates an example of a circuit diagram of a memory array that includes MJJ devices.

FIG. 5 shows how unit cells 502, like unit cell 400 of FIG. 4, can be tiled to form an x-y addressable memory array 500, with word write lines 506, 510 and bit write lines 508, 512 applying hard- and easy-axis fields to each MJJ device 504. Read lines 514, 518, 516, 520 use the cell inductance to form LC ladder transmission lines for fast signal propagation. Although only a 2×2 memory array is shown, larger memory arrays can be patterned similarly to create memories of arbitrary size.

The materials and devices described herein improve the magnetic switching of a magnetic thin-film material to be used as a fixed (magnetically hard) layer in a JMRAM junction in a way that is compatible with maintaining high critical currents through the junction. The present disclosure further includes a method of fabricating the materials and devices described herein, consisting of depositing in order the layers shown in any of FIG. 1 as described above with respect to FIG. 1 to build up the illustrated layer stack, or depositing the layers with the first magnetic layer 110 above the spacer layer 112 and the bilayer 114 below the space layer 112, as previously described.

Figure 6:
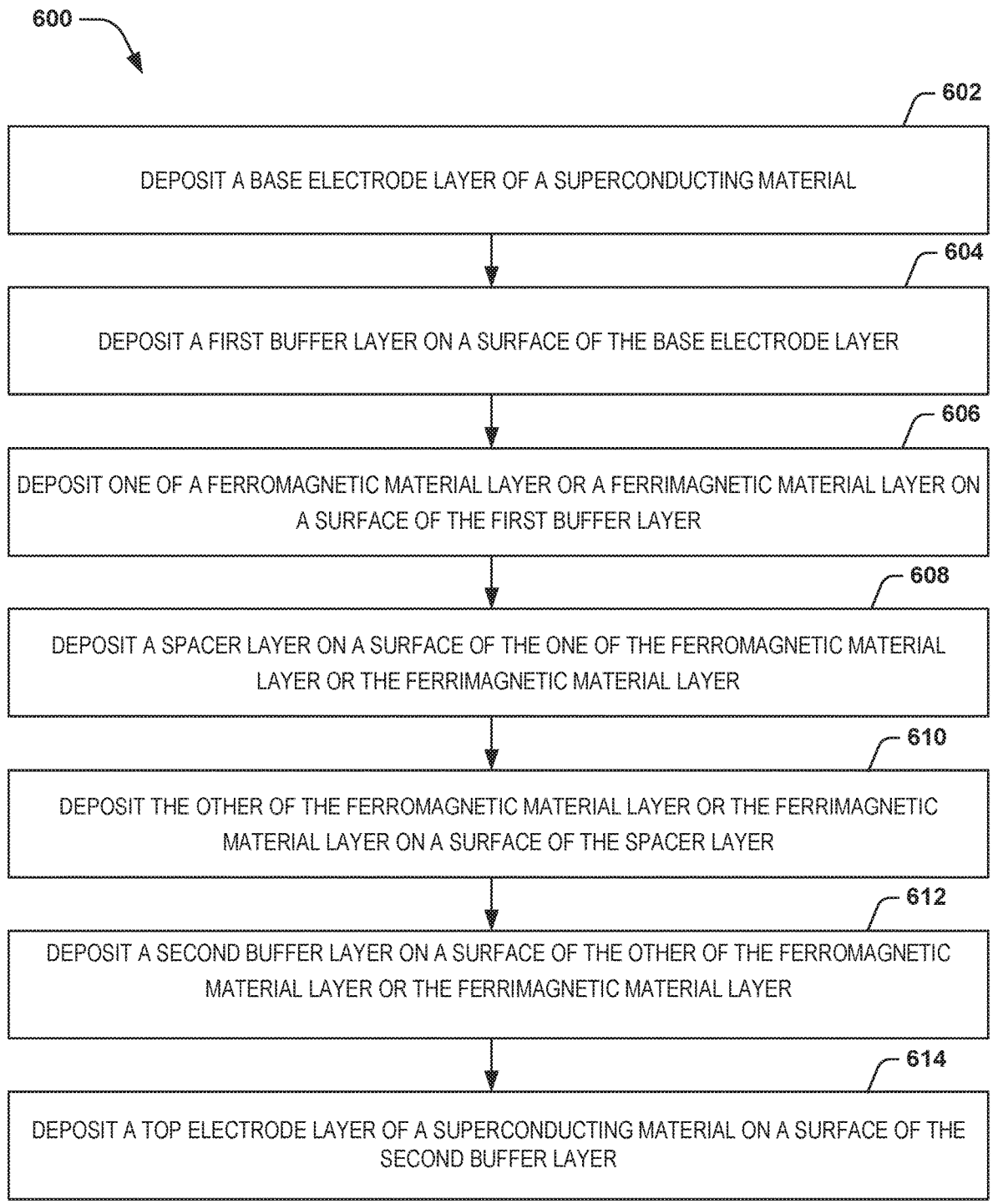
FIG. 6 illustrates an example of a method for fabricating an MJJ system.

In view of the foregoing structural and functional features described above, a methodology in accordance with various aspects of the disclosure will be better appreciated with reference to FIG. 6. FIG. 6 illustrates an example of a method 600 for fabricating an MJJ system (e.g., the MJJ device 100). It is to be understood and appreciated that the method of FIG. 6 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 602, a base electrode layer (e.g., the base electrode layer 102) of a superconducting material is deposited. At 604, a first buffer layer (e.g., the first buffer layer 104) is deposited on a surface of the base electrode layer. At 606, one of a ferromagnetic material layer (e.g., the ferromagnetic material layer 110) or a ferrimagnetic material layer (e.g., the ferrimagnetic material layer 114) is deposited on a surface of the first buffer layer. At 608, a spacer layer (e.g., the spacer layer 112) is deposited on a surface of the one of the ferromagnetic material layer or the ferrimagnetic material layer. At 610, the other of the ferromagnetic material layer or the ferrimagnetic material layer is deposited on a surface of the spacer layer. At 612, a second buffer layer (e.g., the second buffer layer 120) is deposited on a surface of the other of the ferromagnetic material layer or the ferrimagnetic material layer. At 614, a surface electrode layer (e.g., the surface electrode layer 122) of a superconducting material is deposited on a surface of the second buffer layer.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A magnetic Josephson junction (MJJ) system comprising:
   a first superconducting material layer and a second superconducting material layer each configured respectively as a galvanic contacts;
   a ferrimagnetic material layer arranged between the first and second superconducting material layers and that is configured to exhibit a fixed net magnetic moment at a predetermined operating temperature of the MJJ system;
   a ferromagnetic material layer arranged between the first and second superconducting material layers and that is configured to exhibit a variable magnetic orientation in response to an applied magnetic field, the MJJ system being configured to store a binary logical value based on a direction of the variable magnetic orientation of the ferromagnetic material layer; and
   a spacer layer arranged between the ferromagnetic and the ferrimagnetic material layers.

2. The system of claim 1, wherein the ferrimagnetic material layer comprises at least one of a material composition and a layer thickness that is configured to set the fixed net magnetic moment to approximately zero at the predetermined operating temperature of the MJJ system.

3. The system of claim 1, further comprising:
a first buffer layer arranged between the first superconducting material layer and the ferromagnetic material layer; and
a second buffer layer arranged between the second superconducting material layer and the second magnetic layer.

4. The system of claim 3, wherein the ferromagnetic material layer is arranged in contact with the first buffer layer on a first surface and the spacer layer on a second surface opposite the first surface, and wherein the ferrimagnetic material layer is arranged in contact with the second buffer layer on a first surface and the spacer layer on a second surface opposite the first surface.

5. The system of claim 1, wherein the ferromagnetic material layer comprises one of elemental cobalt, elemental iron, a cobalt-iron alloy, a nickel-iron alloy, or a nickel-iron-chromium alloy.

6. The system of claim 1, wherein the ferrimagnetic material layer is one of a $Gd_xFe_{1-x}$ layer, a $Gd_xCo_{1-x}$ layer, and a $Dy_xCo_{1-x}$ layer.

7. The system of claim 1, wherein the first superconducting material layer has a thickness of between about one hundred nanometers and about two hundred nanometers, and wherein the second superconducting material layer has a thickness of between about twenty nanometers and about one hundred nanometers, and wherein the first and second superconducting material layers comprises one of niobium, niobium nitride, or aluminum.

8. The system of claim 1, wherein the spacer layer comprises at least one of non-magnetic transition metal elemental copper, elemental ruthenium, elemental iridium, or elemental rhodium and has a thickness of between about 2.5 nanometers and about 7.5 nanometers.

9. The system of claim 1, wherein the ferrimagnetic layer has a thickness of between approximately 5 angstroms and approximately 20 angstroms.

10. A superconducting memory element comprising the MJJ system of claim 1, and further comprising a write line that is inductively coupled to the ferromagnetic material layer to provide controlled switching of the MJJ device to store one of a first logic state corresponding to the variable magnetic orientation of the ferromagnetic material layer having a first direction and a second logic state corresponding to the variable magnetic orientation of the ferromagnetic material layer having a second direction opposite the first direction.

11. A method for fabricating a magnetic Josephson junction (MJJ) system, the method comprising:
depositing a base electrode layer of a superconducting material;
depositing a first buffer layer on a surface of the base electrode layer;
depositing one of a ferromagnetic material layer or a ferrimagnetic material layer on a surface of the first buffer layer;
depositing a spacer layer on a surface of the one of the ferromagnetic material layer or the ferrimagnetic material layer;
depositing the other of the ferromagnetic material layer or the ferrimagnetic material layer on a surface of the spacer layer;
depositing a second buffer layer on a surface of the other of the ferromagnetic material layer or the ferrimagnetic material layer; and
depositing a top electrode layer of a superconducting material on a surface of the second buffer layer.

12. The method of claim 11, further comprising fabricating the ferrimagnetic material layer to comprise at least one of a material composition and a layer thickness that is configured to set a fixed net magnetic moment to approximately zero at a predetermined operating temperature of the MJJ system.

13. The method of claim 11, further comprising fabricating the ferromagnetic material layer to comprise one of elemental cobalt, elemental iron, a cobalt-iron alloy, a nickel-iron alloy, or a nickel-iron-chromium alloy.

14. The method of claim 11, further comprising fabricating the ferrimagnetic material layer to comprise one of $Gd_xFe_{1-x}$ and $Gd_xCo_{1-x}$.

15. The method of claim 11, further comprising fabricating the ferrimagnetic material layer to have a thickness of between approximately 5 angstroms and approximately 20 angstroms.

16. A magnetic Josephson junction (MJJ) system comprising:
a first superconducting material layer and a second superconducting material layer each configured respectively as a galvanic contacts;
a ferrimagnetic material layer arranged between the first and second superconducting material layers, the ferrimagnetic material layer comprising at least one of a material composition and a layer thickness that is configured to set a fixed net magnetic moment to approximately zero at a predetermined operating temperature of the MJJ system;
a ferromagnetic material layer arranged between the first and second superconducting material layers and that is configured to exhibit a variable magnetic orientation in response to an applied magnetic field, the MJJ system being configured to store a binary logical value based on a direction of the variable magnetic orientation of the ferromagnetic material layer; and
a spacer layer arranged between the ferromagnetic and the ferrimagnetic material layers.

17. The system of claim 16, further comprising:
a first buffer layer arranged in contact with the first superconducting material layer at a first surface and the ferromagnetic material layer at a second surface opposite the first surface, wherein the ferromagnetic material layer is arranged in contact with the spacer layer; and
a second buffer layer arranged in contact with the second superconducting material layer at a first surface and the ferromagnetic material layer at a second surface opposite the first surface, wherein the ferrimagnetic material layer is arranged in contact with the spacer layer.

18. The system of claim 16, wherein the ferrimagnetic material layer is one of a $Gd_xFe_{1-x}$ layer and a $Gd_xCo_{1-x}$ layer.

19. The system of claim 16, wherein the ferrimagnetic layer has a thickness of between approximately 5 angstroms and approximately 20 angstroms.

20. A superconducting memory element comprising the MJJ system of claim 16, and further comprising a write line that is inductively coupled to the ferromagnetic material layer to provide controlled switching of the MJJ device to store one of a first logic state corresponding to the variable magnetic orientation of the ferromagnetic material layer having a first direction and a second logic state corresponding to the variable magnetic orientation of the ferromagnetic material layer having a second direction opposite the first direction.

\* \* \* \* \*